United States Patent
Den Boef et al.

(10) Patent No.: US 12,061,421 B2
(45) Date of Patent: Aug. 13, 2024

(54) METHOD AND SYSTEM FOR DETERMINING INFORMATION ABOUT A TARGET STRUCTURE

(71) Applicant: ASML Netherlands B.V., Veldhoven (NL)

(72) Inventors: Arie Jeffrey Den Boef, Waalre (NL); Kaustuve Bhattacharyya, Veldhoven (NL); Keng-Fu Chang, Hsinchu (TW); Simon Gijsbert Josephus Mathijssen, Rosmalen (NL)

(73) Assignee: ASML Netherlands B.V., Veldhoven (NL)

( * ) Notice: Subject to any disclaimer, the term of this patent is extended or adjusted under 35 U.S.C. 154(b) by 118 days.

(21) Appl. No.: 17/629,053

(22) PCT Filed: Jul. 17, 2020

(86) PCT No.: PCT/EP2020/070284
§ 371 (c)(1),
(2) Date: Jan. 21, 2022

(87) PCT Pub. No.: WO2021/013726
PCT Pub. Date: Jan. 28, 2021

(65) Prior Publication Data
US 2022/0276569 A1 Sep. 1, 2022

(30) Foreign Application Priority Data
Jul. 25, 2019 (EP) .................................. 19188241

(51) Int. Cl.
*G03F 7/00* (2006.01)
(52) U.S. Cl.
CPC ................................ *G03F 7/70633* (2013.01)
(58) Field of Classification Search
CPC .................... G03F 7/70616; G03F 7/70633
See application file for complete search history.

(56) References Cited

U.S. PATENT DOCUMENTS 8,339,595 B2 12/2012 Den Boef
2002/0158193 A1* 10/2002 Sezginer ............... H01L 22/34
250/237 G (Continued)

FOREIGN PATENT DOCUMENTS

TW 201821907 A 6/2018
TW 201921136 A 6/2019

(Continued)

OTHER PUBLICATIONS

International Search Report and Written Opinion of the International Searching Authority directed to related International Patent Application No. PCT/EP2020/070284, mailed Oct. 27, 2020; 10 pages.

(Continued)

*Primary Examiner* — Deoram Persaud
(74) *Attorney, Agent, or Firm* — Sterne, Kessler, Golstein & Fox P.L.L.C.

(57) ABSTRACT

Methods and systems for determining information about a target structure are disclosed. In one arrangement, a value of an asymmetry indicator for the target structure is obtained. The value of the asymmetry indicator represents an amount of an overlay independent asymmetry in the target structure. An error in an initial overlay measurement performed on the target structure at a previous time is estimated. The estimation is performed using the obtained value of the asymmetry indicator and a relationship between values of the asymmetry indicator and overlay measurement errors caused at least partially by overlay independent asymmetries. An overlay in the target structure is determined using the initial overlay measurement and the estimated error.

15 Claims, 10 Drawing Sheets

(56) References Cited

U.S. PATENT DOCUMENTS

| | | |
|---|---|---|
| 2012/0013881 A1 | 1/2012 | Den Boef et al. |
| 2013/0035888 A1* | 2/2013 | Kandel ............... G03F 7/70633 702/81 |
| 2016/0161864 A1 | 6/2016 | Middlebrooks et al. |
| 2017/0307983 A1* | 10/2017 | Den Boef ............ G01N 21/956 |
| 2018/0088470 A1 | 3/2018 | Bhattacharyya et al. |
| 2018/0129139 A1* | 5/2018 | Jiang ................... G03F 7/70683 |
| 2018/0173105 A1* | 6/2018 | Warnaar ................ G03F 7/7065 |
| 2019/0049859 A1 | 2/2019 | Tsiatmas et al. |
| 2019/0072862 A1 | 3/2019 | Tarabrin |
| 2019/0079413 A1 | 3/2019 | Mathijssen et al. |
| 2019/0079414 A1* | 3/2019 | Straaijer ............. G03F 7/70616 |
| 2019/0094703 A1 | 3/2019 | Jak et al. |
| 2019/0129316 A1* | 5/2019 | Zhou ................... G03F 7/70633 |
| 2019/0155173 A1 | 5/2019 | Tsiatmas et al. |
| 2024/0027918 A1* | 1/2024 | Mathijssen ......... G03F 7/70633 |

FOREIGN PATENT DOCUMENTS

| | | |
|---|---|---|
| TW | 201921149 A | 6/2019 |
| TW | 201921152 A | 6/2019 |
| TW | 201921181 A | 6/2019 |
| TW | 201925910 A | 7/2019 |
| WO | WO2015/018625 A1 | 2/2015 |
| WO | WO 2016/169901 A1 | 10/2016 |
| WO | WO 2019/048225 A1 | 3/2019 |

OTHER PUBLICATIONS

Juyou Du et al: "Calibration method of overlay measurement error caused by asymmetric mark", Applied Optics, vol. 57, No. 33, Nov. 20, 2018 (Nov. 20, 2018), p. 9814, XP055576875, ISSN: 1559-128X, Doi: 10.1364/AO.57.009814.

Ullah Md Zakir et al: "Qmerit-calibrated overlay to improve overlay accuracy and device performance", Visual Communications and Image Processing; Jan. 20, 2004-Jan. 20, 2004; SAN JOSE, vol. 9424, Mar. 19, 2015 (Mar. 19, 2015), pp. 942425-942425, XP060051698, Doi: 10.1117/12.2085005 ISBN: 978-1-62841-730-2.

International Preliminary Report on Patentability directed to related International Patent Application No. PCT/EP2020/070284, issued Jan. 25, 2022; 7 pages.

* cited by examiner

METHOD AND SYSTEM FOR DETERMINING INFORMATION ABOUT A TARGET STRUCTURE

This application claims priority of EP application 19188241.4 which was filed on Jul. 25, 2019 and which is incorporated herein in its entirety by reference.

The present invention relates to determining information about a target structure on a substrate, such as overlay.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometer have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a range of data from which a property of interest of the target can be determined.

Determination of the property of interest may be performed by various techniques: e.g., reconstruction of the target structure by iterative approaches such as rigorous coupled wave analysis or finite element methods; library searches; and principal component analysis.

The targets used by some scatterometers are relatively large gratings, e.g., 40 µm by 40 µm, and the measurement beam generates a spot that is smaller than the grating (i.e., the grating is underfilled). This simplifies mathematical reconstruction of the target as it can be regarded as infinite. However, in order to reduce the size of the targets, e.g., to 10 µm by 10 µm or less, so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Diffraction-based overlay using dark-field detection of the diffraction orders enables overlay measurements on smaller targets. These targets can be smaller than the illumination spot and may be surrounded by product structures on a substrate. Multiple targets can be measured in one image.

In the known metrology technique, overlay measurement results are obtained by measuring the target twice under certain conditions, while either rotating the target or changing the illumination mode or imaging mode to obtain separately the −1 and the +1 diffraction order intensities. Comparing these intensities for a given grating provides an indicator of overlay.

Although the known dark-field image-based overlay measurements are fast and computationally simple (once calibrated), they rely on an assumption that overlay is the only cause of asymmetry in the target structure. Any other asymmetry in the stack, such as asymmetry of features within one or both of the overlaid gratings, may also contribute to differences of intensity between the −1 and +1 orders. Such overlay independent asymmetry can reduce the accuracy of the overlay measurements.

It is desirable to improve overlay measurements.

According to an aspect of the invention, there is provided a method of determining information about a target structure on a substrate, comprising: obtaining a value of an asymmetry indicator for the target structure, the value of the asymmetry indicator representing an amount of an overlay independent asymmetry in the target structure, the overlay independent asymmetry being an asymmetry that is not caused by overlay; estimating an error in an initial overlay measurement performed on the target structure at a previous time, the estimation being performed using the obtained value of the asymmetry indicator and a relationship between values of the asymmetry indicator and overlay measurement errors caused at least partially by overlay independent asymmetries; and determining overlay in the target structure using the initial overlay measurement and the estimated error.

According to an aspect of the invention, there is provided a system for determining information about a target structure on a substrate, the system comprising a processor configured to: obtain a value of an asymmetry indicator for the target structure, the value of the asymmetry indicator representing an amount of an overlay independent asymmetry in the target structure, the overlay independent asymmetry being an asymmetry that is not caused by overlay; estimate an error in an initial overlay measurement performed on the target structure at a previous time, the estimation being performed using the obtained value of the asymmetry indicator and a relationship between values of the asymmetry indicator and overlay measurement errors caused at least partially by overlay independent asymmetries; and determine overlay in the target structure using the initial overlay measurement and the estimated error.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

Embodiments will now be described, by way of example only, with reference to the accompanying drawings in which.

The features and advantages of the present invention will become more apparent from the detailed description set forth below when taken in conjunction with the drawings.

This specification discloses one or more embodiments that incorporate the features of this invention. The disclosed embodiment(s) merely exemplify the invention. The scope of the invention is not limited to the disclosed embodiment (s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals, and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Figure 1:
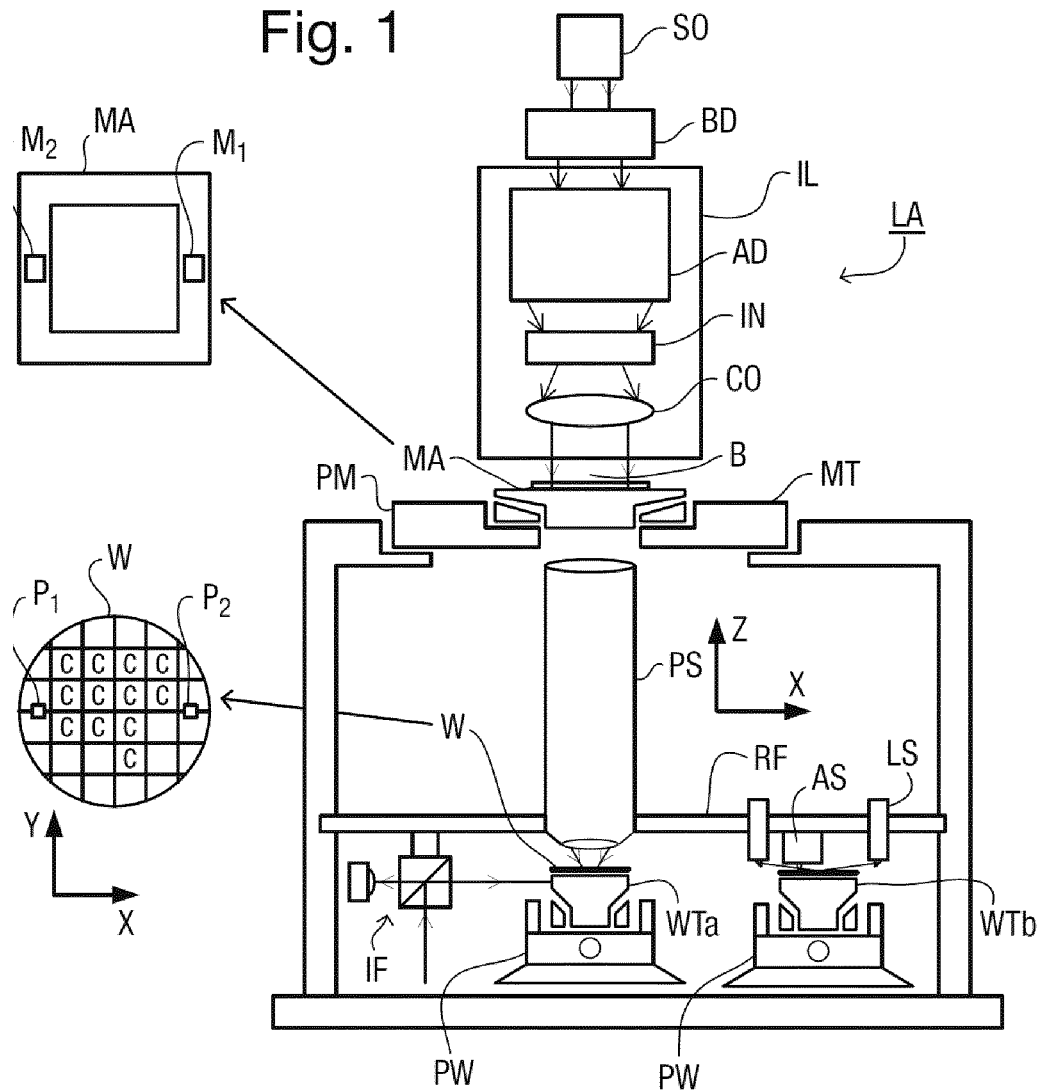
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam.

Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks PI, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept substantially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept substantially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa, WTb and two stations—an exposure station and a measurement station— between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

Figure 2:
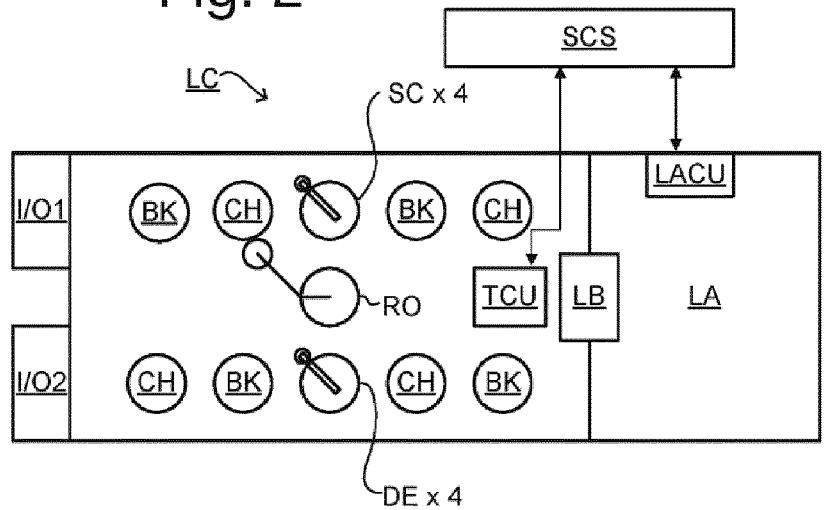
FIG. 2 depicts a lithographic cell or cluster.

As shown in FIG. 2, the lithographic apparatus LA forms part of a lithographic cell LC, also sometimes referred to a lithocell or cluster, which also includes apparatus to perform pre- and post-exposure processes on a substrate. These include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Detecting first order diffracted light from a target structure, such as a stacked grating, with overlay error is known, for example as described in U.S. Pat. No. 8,339,595B2 which is hereby incorporated by reference in its entirety. As described in WO 2015018625, which is hereby incorporated by reference in its entirety, a target may be irradiated to take a measurement relating to the overlay at the target. As is described in further detail in WO 2015018625, diffracted radiation can be detected and different orders of diffraction can be determined, such as the first order diffraction. Asymmetry in the intensity of radiation in a specific diffracted order can be used to determine the overlay at the target. Any appropriate sort of measurement apparatus may be used to measure the intensity asymmetry of a target. For example, as described in WO 2015018625 a micro diffraction based overlay (uDBO) metrology apparatus may be used which can be a stand-alone device or incorporated in either the lithographic apparatus LA, e.g., at the measurement station, or the lithographic cell LC. The intensity asymmetry can be measured in different ways at different polarizations and wavelengths.

Overlay represents an accuracy of alignment between different periodic structures in the target structure (e.g. overlying gratings in different layers). In some embodiments, the target structure comprises multiple pairs of gratings having different respective overlay biases (i.e. different deliberately applied overlay offsets). The target structure may also comprise gratings having different orientations, such as gratings configured to respectively diffract incoming radiation in orthogonal X and Y directions (which may be referred to as X-direction and Y-direction gratings). As an example, a target structure may comprise one X-direction grating having a bias of +d and one X-direction grating having a bias of −d. A grating having a bias of d means that the grating has overlying components arranged so that if the overlying components were both printed exactly at their nominal locations one of the overlying components would be offset relative to the other of the overlaying components by a distance d. Gratings with biases of +d and −d would have components arranged so that if perfectly printed the offsets would be in the opposite direction to each other. In an embodiment, the target structure additionally comprises one Y-direction grating having a bias of +d and one Y-direction grating having a bias of −d. The target structure may be formed and measured as described in WO 2015018625. The magnitude of the bias d of each grating is typically small in comparison with a width of the grating, such as around 20 nm.

As described, in an embodiment at least one periodic structure (e.g. grating) in the target structure comprises a plus-bias offset (e.g. +d) and a minus-bias offset (e.g. −d). An intensity asymmetry between different diffraction orders (e.g. between the −1 and the +1 diffraction orders) can be measured separately for each of the plus-bias and the minus-bias parts of the target structure. A value of the intensity asymmetry for the plus-bias part of the target structure may be referred to as an $A^+$ value. A value of the intensity asymmetry for the minus-bias part of the target structure may be referred to as an $A^-$ value. The $A^+$ value is proportional to the overlay in the plus-bias part of the target structure, with a proportionality constant k which is referred to as a sensitivity constant. The $A^-$ value is proportional to the overlay in the minus-bias part of the target structure, with the proportionality constant k. The effect of overlay independent asymmetry can be seen in plots of the $A^+$ values against $A^-$ values over a range of different wavelengths of incident radiation.

Figure 3A:
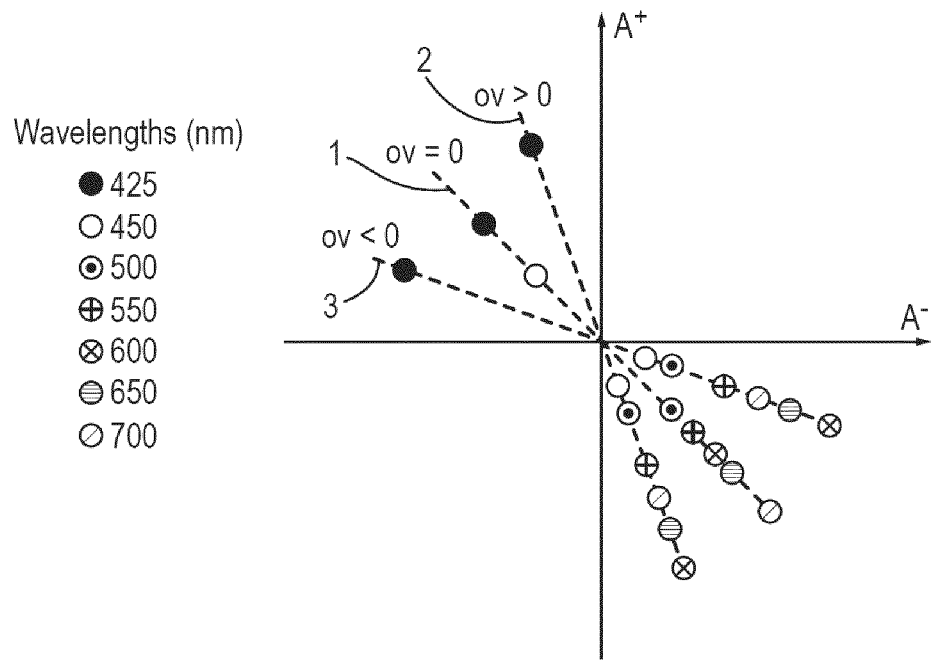
FIG. 3A depicts a plot of $A^+$ against $A^-$ for an overlay grating that has no overlay independent asymmetry.

FIG. 3A depicts a plot of $A^+$ against $A^-$ for a target structure in which no overlay independent asymmetry is present. The target structure is measured at multiple different wavelengths. The wavelengths used are exemplary. In this ideal case, all the data points lie on the same straight line for each of the three different overlays considered. When there is no overlay independent asymmetry, the straight line passes through the plot origin. As the overlay is proportional to the intensity asymmetry between the opposite diffraction orders, the overlay can be determined from the gradient of the line. Overlay, ov, can be determined by using the following approximated equation:

$$ov = d * \frac{m+1}{m-1}$$

where d is the known bias of the target structure being measured, and $m = A^+/A^-$.

Three different sets of measurements are shown in FIG. 3A, representing respectively no overlay (ov=0; line 1 of FIG. 3A), positive overlay (ov>0; typically 0<ov<20 nm; line 2 of FIG. 3A) and negative overlay (ov<0; typically −20<ov<0 nm; line 3 of FIG. 3A). The gradient of line 1 of FIG. 3A (ov=0) is −1. When the gradient is greater than −1, such as in line 2 of FIG. 3A, the overlay is greater than zero. When the gradient of the line is smaller than −1, such as in line 3 of FIG. 3A, the overlay is less than zero.

Figure 4:
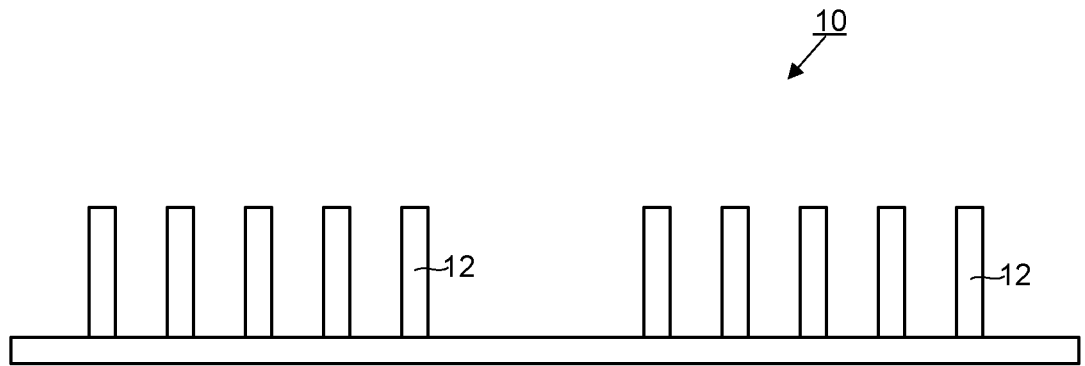
FIG. 4 depicts two unit cells of an example periodic structure with no overlay independent asymmetry.
Figure 5:
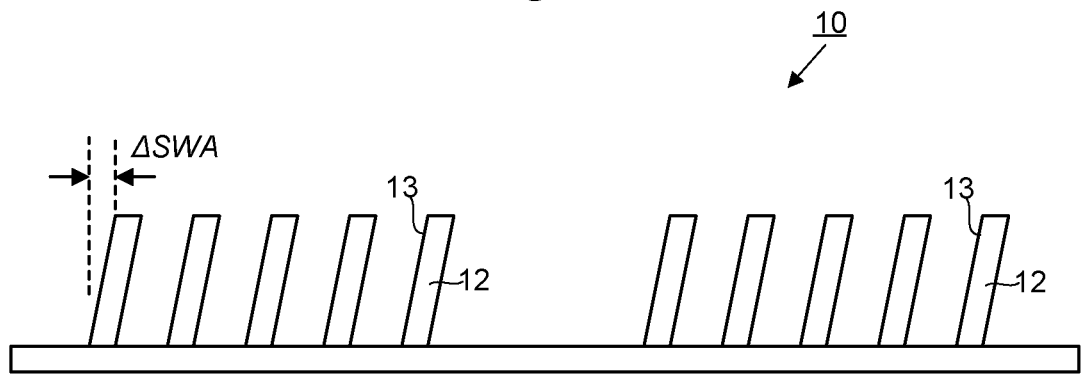
FIG. 5 depicts the units cells of the periodic structure of FIG. 4 with side wall angle asymmetry.
Figure 6:
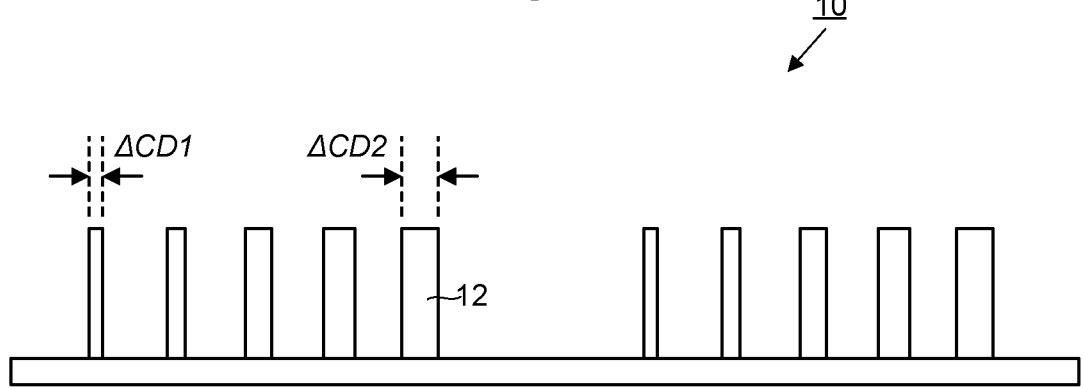
FIG. 6 depicts the unit cells of the periodic structure of FIG. 4 with critical dimension imbalance.

Referring to FIGS. 4-6, fabrication errors cause imperfections in target structures to be used for overlay measurements. These imperfections may include one or more asymmetries that are not caused by overlay. Each asymmetry that is not caused by overlay may be referred to as an overlay independent asymmetry.

FIG. 4 schematically depicts two example unit cells of a perfectly formed grating 10 of an example target structure. Each grating line 12 has perfectly vertical walls. All of the grating lines 12 have the same width. The grating 10 does not have any overlay independent asymmetry. If the target structure had a further such grating positioned in a different layer, a misalignment between the two gratings associated with overlay would cause the target structure to have an asymmetry that would be dependent only on overlay. Scattering measurements performed on such a target structure would be able to determine the overlay from asymmetries in the scattered radiation (such as asymmetry between measured intensities of +1 and −1 diffraction orders). The absence of any overlay independent asymmetry in the target structure means that such measurements would be able to determine overlay with high accuracy.

Imperfections in target structures introduce overlay independent asymmetries. FIG. 5 depicts an example asymmetry mode resulting from tilting of the side walls 13 of the grating lines 12. This asymmetry mode may be referred to as side wall asymmetry. A magnitude of the side wall asymmetry, $\Delta SWA$, may be defined as the lateral shift between the top of a side wall 13 and the bottom of the side wall 13, as indicated in FIG. 5. Side wall asymmetry can for instance be caused by imperfections in etching processes. FIG. 6 depicts another example asymmetry mode, resulting from variation in the critical dimension across the target structure. In this case, the variation in the critical dimension (CD) results in a variation in the width of the lines 12 of the grating 10. This asymmetry mode may be referred to as CD imbalance. A magnitude of the CD imbalance may be defined as $\Delta CD = \Delta CD2 - \Delta CD1$.

Overlay independent asymmetries may contribute to asymmetry in scattered radiation, such as asymmetry between measured intensities of +1 and −1 diffraction orders, potentially leading to errors in overlay measurements that rely on asymmetry in scattered radiation.

Figure 3B:
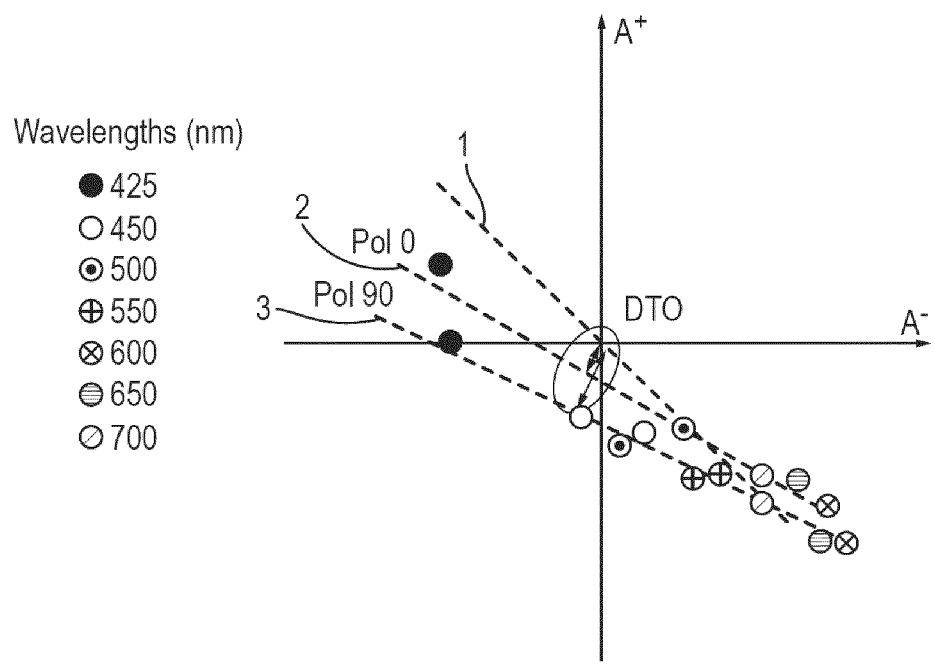
FIG. 3B depicts a plot of $A^+$ against $A^-$ for an overlay grating that has overlay independent asymmetry.

FIG. 3B depicts plots of $A^+$ against $A^-$ for a target structure having overlay independent asymmetry. Line 1 in FIG. 3B is provided for reference only and corresponds to the case where the target structure has no overlay independent asymmetry and no overlay. Lines 2 and 3 in FIG. 3B are best fit lines through data points corresponding respectively to two orthogonal polarizations (line 2 corresponds to a polarization with the electric field vector parallel to a direction of a grating in the target structure and line 3 corresponds to a polarization with the electric field vector at 90° to the direction of the grating in the target structure). Unlike in FIG. 3A, the data points corresponding to lines 2 and 3 do not fit exactly along straight lines. Furthermore, best fit lines do not pass through the origin.

The distance of the best fit lines to the plot origin, which may be referred to as DTO (distance-to-origin) provides an asymmetry indicator. The distance-to-origin (DTO) for each set of data is the shortest distance from the plot origin to the line, i.e. at 90° to the line of best fit through the points on the graph to the plot origin. A value of the asymmetry indicator (e.g. the DTO) represents an amount of an overlay independent asymmetry in the target structure.

In the example of FIG. 3B, the target structure is irradiated at different polarizations. Lines 2 and 3 in FIG. 3B respectively show data points obtained from the same target using the two different polarizations. FIG. 3B shows that the data points for the two polarizations lie on two different lines with different gradients and different DTOs. The DTOs for lines 2 and 3 are indicated by the double headed arrows in the elliptical region near the plot origin in FIG. 3B.

It can be seen from the discussion above that measurements of overlay that depend on detecting asymmetry in scattered radiation may be affected by overlay independent asymmetry in a target structure. The overlay independent asymmetry is expected to vary significantly between different target structures and can thus cause significant errors in overlay measurements. The embodiments described below aim to improve the extent to which overlay independent asymmetry is taken into account and thereby improve overlay measurements.

A preliminary investigation was performed to determine the extent to which overlay independent asymmetries contribute to errors in overlay measurements. A plurality of target structures were measured at plural wavelengths and plural polarization states (including TE and TM polarizations). Plots of $A^+$ against $A^-$ were obtained for each of the target structures and each of the polarizations. A best fit line was derived for each target structure and each polarization. A gradient s of the best fit line was used to derive an overlay measurement, $OV_{A^+A^-}$, based on the $A^+$ and $A^-$ plot using the following relationship:

$$OV_{A^+A^-} = d\frac{s+1}{s-1}$$

A value of an asymmetry indicator (DTO in this example) was obtained for each target structure and each polarization. Additionally, a reference tool (which could be an e-beam device) can be used to obtain an independent measure of the overlay $OV_{ref}$ in each target structure. An overlay measurement error can then be determined by the difference: $\Delta OV = OV_{ref} - OV_{A^+A^-}$. This preliminary investigation revealed both that a wide range of overlay measurement errors are observed and that there is a clear correlation between the overlay measurement error and the asymmetry indicator, i.e. in this case between the DTOs derived from the $A^+$ and $A^-$ plots and the corresponding values of $\Delta OV$. By measuring an asymmetry indicator such as DTO it is thus possible to determine an expected value of $\Delta OV$, which can be used to correct an initial measurement of overlay that did not take account of overlay independent asymmetry in the target structure.

Figure 7:
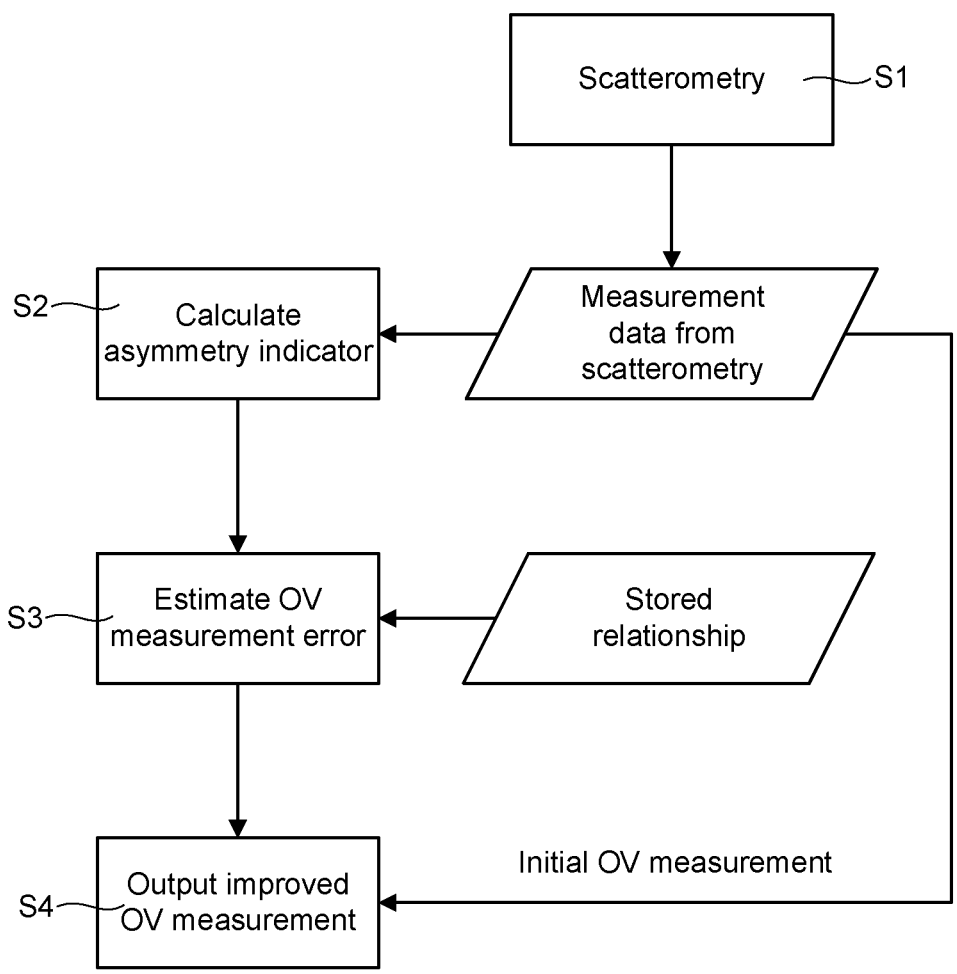
FIG. 7 is a flow chart depicting a method of determining information about a target structure.

FIG. 7 is a flow chart depicting a method of determining information about a target structure on a substrate W. The method comprises obtaining a value of an asymmetry indicator for the target structure. The value of the asymmetry indicator represents an amount of an overlay independent asymmetry in the target structure. The overlay independent asymmetry is an asymmetry that is not caused by overlay. The overlay independent asymmetry does not therefore arise due to a misalignment between periodic structures in different layers of the target structure. In an embodiment, the overlay independent asymmetry comprises plural asymmetry modes. In an embodiment, the plural asymmetry modes comprise an asymmetry mode representing side wall angle asymmetry (e.g. as described above with reference to FIG. 5). In an embodiment, the plural asymmetry modes comprise an asymmetry mode representing asymmetry in a critical dimension (e.g. as described above with reference to FIG. 6 and which may be referred to as CD imbalance). The plural asymmetry modes may comprise other asymmetry modes.

In step S1, the target structure is measured using scatterometry. A radiation beam is directed onto the target structure and scattered radiation is detected. The scatterometry may be performed in a dark field mode, as mentioned above. The scatterometry may comprise separate detection of opposite diffraction orders in order to obtain intensities of the opposite diffraction orders, such as intensities of the −1 and +1 diffraction orders. In an embodiment, the scatterometry is performed at each of a set of wavelengths.

In step S2, measurement data from the scatterometry is used to obtain a value of an asymmetry indicator for the target structure. In an embodiment, the value of the asymmetry indicator is obtained for the target structure using information about asymmetry in radiation scattered from the target structure at each of a set of wavelengths. In an embodiment, the information about asymmetry in radiation scattered from the target structure comprises a difference in detected intensity between different diffraction orders, such as a difference in intensity between equal and opposite diffraction orders such as the +1 and −1 diffraction orders. In an embodiment, the difference in detected intensity between different diffraction orders is obtained for parts of the target structure that have different biases. In an embodiment, the difference in detected intensity is obtained for a part of the target structure having a bias of +d to obtain an $A^+$ value and for a part of the target structure having a bias of −d to obtain an $A^-$ value. The target structure may thus comprise a composite target structure comprising parts having different nominal overlay biases. In an embodiment, determination of the value of the asymmetry indicator comprises fitting a curve to a plot of $A^+$ against $A^-$, where the data points in the plot comprise at least one data point for each of a plurality of wavelengths in the set of wavelengths used in the scatterometry. In an embodiment, the plot of $A^+$ against $A^-$ contains data points corresponding to measurement modes having differences other than differences of wavelength, including for example differences in angle of incidence and/or differences in polarization. The value of the asymmetry indicator may be obtained by calculating a metric representing a deviation between a characteristic of the fitted curve and a characteristic of a reference curve corresponding to a case where there is no overlay independent asymmetry or between a characteristic of the fitted curve and a characteristic common to a range of reference curves corresponding to cases where there is no overlay independent asymmetry but a range of different overlays are present. In an embodiment, the characteristic or common characteristic is that the reference curve or reference curves pass through an origin of the plot of $A^+$ against $A^-$. In an embodiment, the value of the asymmetry indicator comprises the shortest distance between the fitted curve and the origin of the plot of $A^+$ against $A^-$. In an embodiment, the fitted curve is a fitted straight line and the value of the asymmetry indicator comprises the shortest distance between the fitted straight line and the origin of the plot of $A^+$ against $A^-$ (referred to above as the distance-to-origin, DTO). In other embodiments, the asymmetry indicator may be defined differently. For example, in one class of embodiment the asymmetry indicator is defined based on a difference in measured overlay values obtained via measurements performed at different wavelengths (the difference being caused at least partially by overlay independent asymmetry). The value of the asymmetry indicator in such embodiments may be obtained by calculating the difference between measured overlay values obtained at two different wavelengths for example. In a further embodiment, the value of the asymmetry indicator is obtained in a metrology measurement step which precedes the lithographic step. In such measurement, the value of the asymmetry indicator may be obtained from measurements of gratings having a uniform profile of the resist overlapping an underlying grating formed in the semiconductor wafer, for example measurements providing Bottom Grating Asymmetry (BGA), as known in the art. Such BGA targets may be used in further overlay metrology measurements, after the top resist is pattern and developed, or may be stand-alone BGA targets. In a further embodiment, the value of the asymmetry indicator is obtained in a metrology measurement step which may be performed with the metrology equipment of a lithographic apparatus, such as the alignment metrology apparatus. In such measurement, alignment targets may be used. In a further embodiment, a method is proposed which comprises a step of comparing an estimated error for a multitude of values of the asymmetry indicator, values which are obtained from different metrology steps, such as measured on metrology targets, for example DTO, such as measured on BGA targets or such as measured on alignment targets. The method compares the correlation of the estimated error for a multitude of type of asymmetry indicators, and selects the type of the asymmetry indicator which provides the best information about the asymmetry.

In step S3, the value of the asymmetry indicator (e.g. DTO) obtained in step S2 is used to estimate an error, $\Delta OV$, in an initial overlay measurement performed on the target structure at a previous time. In an embodiment, the initial overlay measurement is obtained using the measurement data from scatterometry obtained from step S1. In an embodiment, the initial overlay measurement is obtained from the gradient s of a best fit line in the plot of $A^+$ against $A^-$ mentioned above. The initial overlay measurement may thus comprise the overlay measurement, $OV_{A^+A^-}$, derived from the gradient s of a best fit line using the following relationship:

$$OV_{A^+A^-} = d\frac{s+1}{s-1}$$

The estimation of the error $\Delta OV$ is performed based on the expected correlation between the error $\Delta OV$ and the value of the asymmetry indicator noted above. This correlation is represented as a quantified relationship between values of the asymmetry indicator (e.g. DTO) and overlay measurement errors $\Delta OV$. The overlay measurement errors $\Delta OV$ are at least partially caused by overlay independent asymmetries, which are represented by the asymmetry indicator. The description below provides example approaches for obtaining the relationship, including use of calibration measurements (which may be referred to as data-driven approaches) and/or computer simulations (which may be referred to as model-based approaches). The relationship may be determined at an earlier time and step S3 may comprise accessing a stored version of the relationship from a computer accessible memory.

In step S4, an overlay in the target structure is obtained using the initial overlay measurement (e.g. $OV_{A^+A^-}$) and the estimated error (e.g. $\Delta OV$), for example via the relationship $OV=OV_{A^+A^-}+\Delta OV$.

Figure 8:
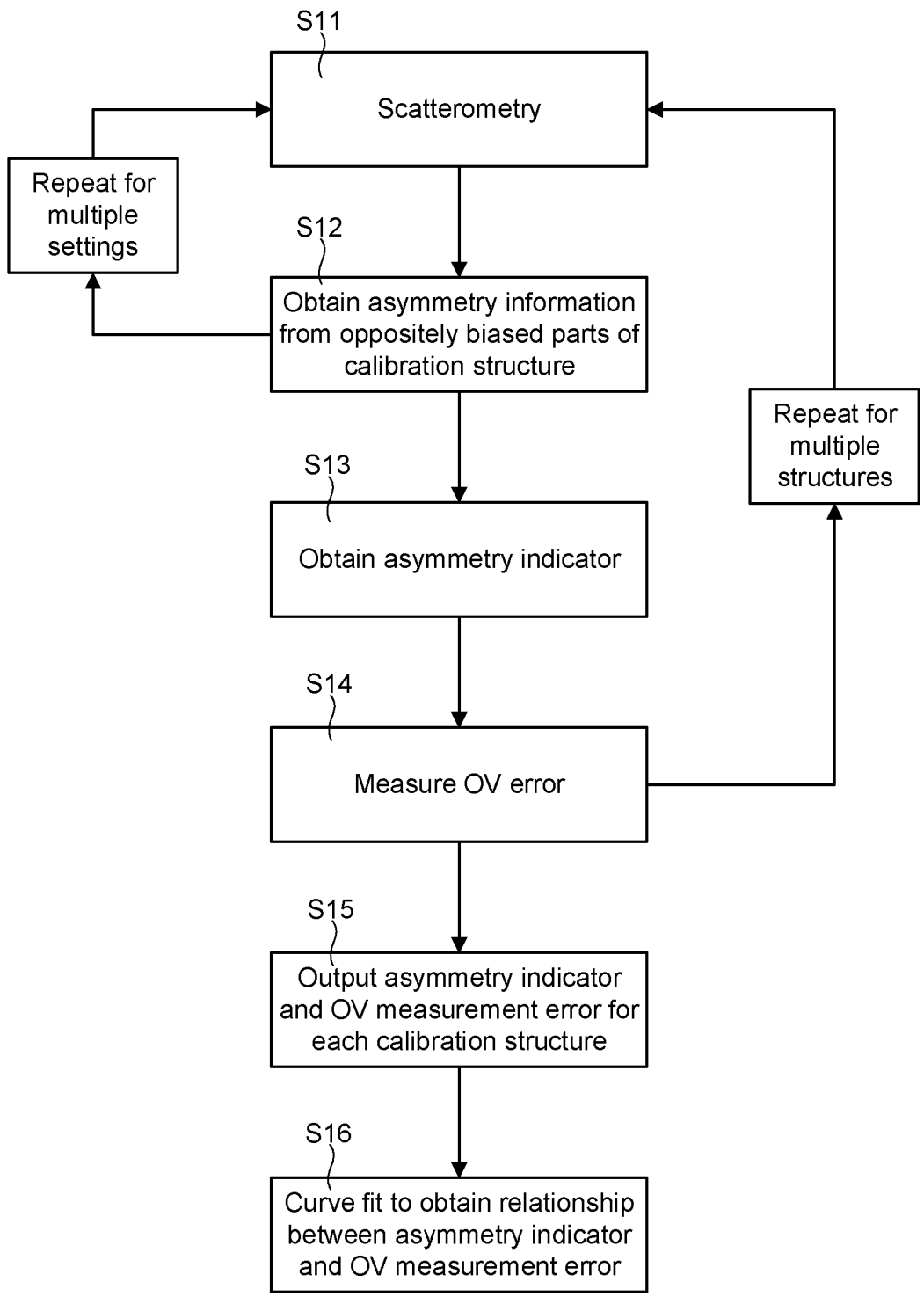
FIG. 8 is a flow chart depicting a method of obtaining a relationship between values of an asymmetry indicator and overlay measurement errors.

FIG. 8 is a flow chart showing an example data-driven approach for deriving the relationship between the values of the asymmetry indicator and overlay measurement errors, usable for example in step S3 of FIG. 7. The method comprises measuring a value of the asymmetry indicator and an overlay measurement error in each of a plurality of calibration structures having different overlay independent asymmetries. The different overlay independent asymmetries may occur via natural variations between calibration structures formed at different times and/or positions. Alternatively, the different overlay independent asymmetries may be at least partly induced deliberately.

In step S11, one of the plurality of calibration structures is measured. The measurement may be performed using scatterometry. The scatterometry may be performed as described above with reference to step S1 of FIG. 7. In an embodiment, as indicated in step S12 of FIG. 8, information about asymmetry in radiation scattered from the calibration structure is obtained. The information about asymmetry may be obtained in any of the ways described above with reference to step S2 of FIG. 7. Thus, each calibration structure may comprise parts having different overlay biases relative to each other, such as equal and opposite overlay biases +d and −d. The information about asymmetry may comprise an $A^+$ value and an $A^-$ value.

Steps S11 and S12 are repeated for each of a set of wavelengths and/or polarizations (or other scatterometry settings). In an embodiment, an $A^+$ value and an $A^-$ value is obtained for the calibration structure at each of the set of wavelengths in the set and/or for each polarization.

In step S13, a value of an asymmetry indicator is obtained using the information about asymmetry (e.g. the $A^+$ values and $A^-$ values) obtained at each of the set of wavelengths and/or polarizations (and repeated, as mentioned below, for multiple calibration structures with different overlay independent asymmetries). In an embodiment, the value of the asymmetry indicator is obtained in any of the ways described above with reference to step S2 of FIG. 7, including for example fitting a straight line to a plot of the $A^+$ values against the $A^-$ values and determining a distance-to-origin value, DTO.

In step S14, an overlay measurement error $\Delta OV$ is obtained. The overlay measurement error may be obtained using a reference tool to obtain an independent measure of the overlay $OV_{ref}$ in the calibration structure and taking the difference between $OV_{ref}$ and an overlay measurement obtained based on the information from steps S11 and S12, such as an overlay measurement, $OV_{A^+A^-}$, based on the gradient s of a best fit line in the plot of $A^+$ against $A^-$, as described above.

Steps S11, S12 and S13 are repeated (S14) for multiple calibration structures with different overlay independent asymmetries.

In step S15, the value of the asymmetry indicator (e.g. DTO) obtained in step S13 and a corresponding overlay measurement error $\Delta OV$ obtained in step S14 is output for each of the calibration structures considered.

In step S16, the output from step S15 is then used to obtain the relationship between values of the asymmetry indicator and overlay measurement errors for use in step S3 of FIG. 7. In the example of FIG. 8, the relationship is obtained by fitting a curve (e.g. a straight line) to a plot of the value of the asymmetry indicator against the corresponding overlay measurement error $\Delta OV$, where each data point represents the value of the asymmetry indicator and the corresponding overlay measurement error $\Delta OV$ for one of the calibration structures. In an embodiment, the process is performed separately for different polarizations to obtain a first curve and a second curve. The first curve is obtained by fitting to a plot of the value of the asymmetry indicator against the corresponding overlay measurement error $\Delta OV$, where each data point represents the value of the asymmetry indicator and the corresponding overlay measurement error $\Delta OV$ for one of the calibration structures obtained via scattering performed in step S11 with radiation having a first polarization. The second curve is obtained by fitting to a plot of the value of the asymmetry indicator against the corresponding overlay measurement error $\Delta OV$, where each data point represents the value of the asymmetry indicator and the corresponding overlay measurement error $\Delta OV$ for one of the calibration structures obtained via scattering performed in step S11 with radiation having a second polarization. In an embodiment, the first polarization is orthogonal to the second polarization. In an embodiment, the one of the first curve and the second curve that has the highest gradient is used as the basis for deriving the relationship between values of the asymmetry indicator and overlay measurement errors in order to achieve maximum sensitivity.

The above data driven approach is mathematically straightforward to implement and does not require any mathematical modelling of, or assumptions about, the calibration structures apart from some basic target properties like pitch and induced bias.

The equation describing the fitted curve provides a representation of the relationship between the values of the asymmetry indicator and overlay measurement errors. A quality of fitting of the curve to the data may provide an indication of the reliability of the representation of the relationship. The quality of the fitting may be quantified in various ways known in the art of mathematical curve fitting (by a metric which describes the accuracy with which the fitted curve fits the data).

The quality of the fitting may depend on the choice of the set of wavelengths that are represented by the data points plotted. In cases where the relationship between values of the asymmetry indicator and overlay measurement errors is to be used in the method of FIG. 7 with only a relatively small set of wavelengths (e.g. less than 10 different wavelengths, optionally less than 5 different wavelengths), the curve fitting of step S16 may be repeated for a plurality of candidate sets of wavelengths (comprising different combinations of wavelengths). Thus, the set of wavelengths to use in the method of FIG. 7 may be preselected by obtaining the relationship between values of the asymmetry indicator and overlay measurement errors for a plurality of candidate sets of wavelengths and selecting one of the candidate sets of wavelengths based on a quality of correlation between the values of the asymmetry indicator and the overlay measurement errors for that candidate set of wavelengths. For example, a set of wavelengths may be selected which allow a curve (e.g. a straight line) to be fitted with high accuracy to the data.

In some embodiments the derivation of the relationship between values of the asymmetry indicator and overlay measurement errors comprises simulating scattering of radiation from a calibration structure for a plurality of simulated overlay independent asymmetries in the calibration structure. Thus, instead of performing scatterometry on physical calibration structures, as described above with reference to FIG. 8, scattering measurements from a range of calibration structures may be simulated. Various approaches are known to simulate such scattering. The simulations may be performed for example using a Monte-Carlo simulation. Such approaches based on simulation may be referred to as model-based approaches because the simulations of the scattering use mathematical models to represent relevant characteristics of the calibration structures.

Figure 9:
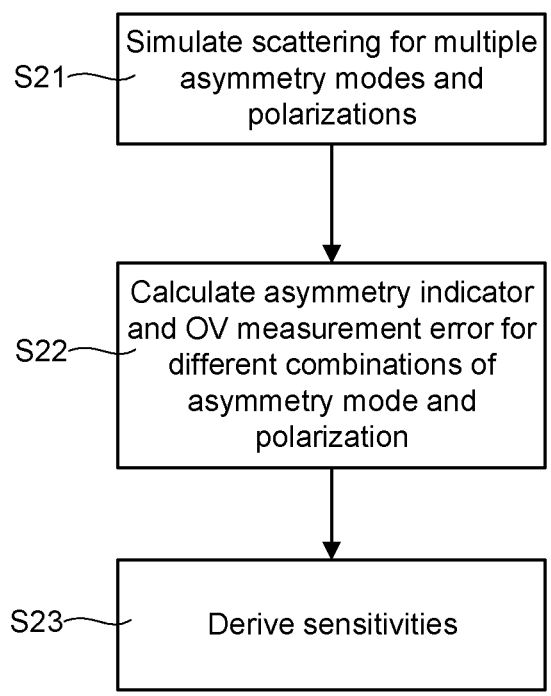
FIG. 9 is a flow chart depicting a model-based approach for determining sensitivities of an asymmetry indicator and overlay measurement errors to different asymmetry modes.

FIG. 9 is a flow chart depicting an example model-based approach.

In step S21, a computer is used to simulate scattering from a theoretical calibration structure represented by a mathematical model. The simulation is repeated for a range of theoretical structures, a range of wavelengths of scattering radiation and, optionally, a range of different polarizations (e.g. two orthogonal polarizations). The range of theoretical structures may include theoretical structures having a plurality of different overlays. The range of theoretical structures may also include a plurality of different overlay independent asymmetries (e.g. with ΔSWA and ΔCD varying in the range of 0 nm±1 nm). The plurality of different overlay independent asymmetries may comprise plural magnitudes of asymmetry. Alternatively or additionally, the plurality of different overlay independent asymmetries may comprise plural asymmetry modes. For example, the plural asymmetry modes may comprise a first asymmetry mode representing side wall angle asymmetry (which may be referred to as ΔSWA) and a second asymmetry mode representing asymmetry in a critical dimension (which may be referred to as ΔCD).

In step S22, values of the asymmetry indicator (e.g. DTO) and overlay measurement error are calculated, via the simulations of step S21, for plural combinations of overlay, overlay independent asymmetry and/or polarization.

In step S23, the calculated values of the asymmetry indicators and overlay measurement errors are used to derive sensitivities of the asymmetry indicator (e.g. DTO) to each of the asymmetry modes (e.g. ΔSWA and ΔCD). A sensitivity of a first quantity to a second quantity in this context represents how the first quantity is expected to change in response to a change in the second quantity. If the sensitivity is known it is possible to derive a change in the first quantity from knowledge of a change in the second quantity. In an embodiment, the calculated asymmetry indicators and overlay measurement errors are further used to derive sensitivities of the overlay measurement error ΔOV to each of the asymmetry modes (e.g. ΔSWA and ΔCD). In an embodiment, the calculated asymmetry indicators and overlay measurement errors are used to derive sensitivities of the asymmetry indicator (e.g. DTO) to each of the asymmetry modes (e.g. ΔSWA and ΔCD) for each of multiple incident polarizations (e.g. TE and TM). In an embodiment, the calculated asymmetry indicators and overlay measurement errors are further used to derive sensitivities of the overlay measurement error ΔOV to each of the asymmetry modes for each of multiple incident polarizations.

Figure 10:
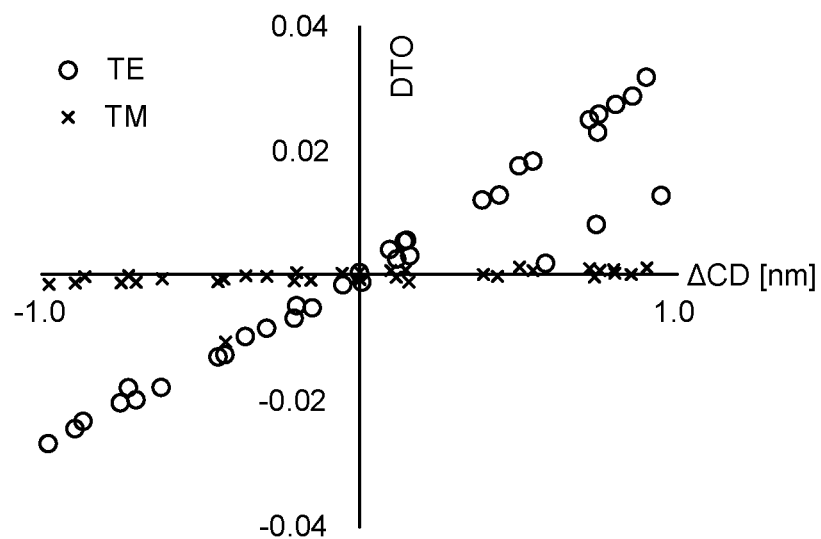
FIG. 10-13 are graphs depicting asymmetry indicators (FIGS. 10 and 11) and overlay measurement errors (FIGS. 12 and 13) from simulated scattering measurements for different asymmetry modes in a target structure and different polarizations of incident radiation.
Figure 11:
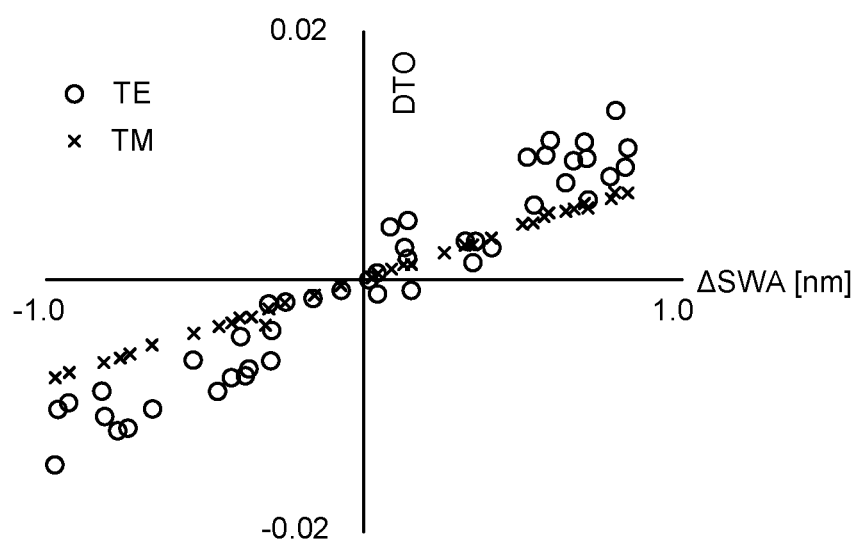
Figure 12:
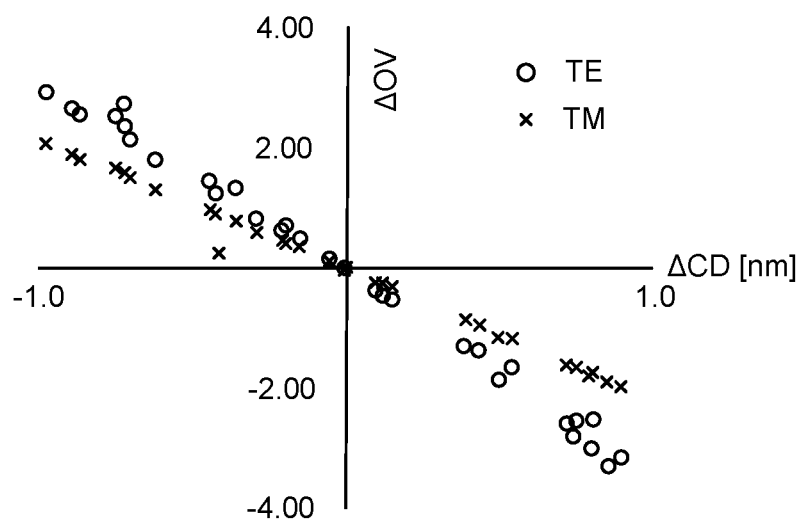
Figure 13:
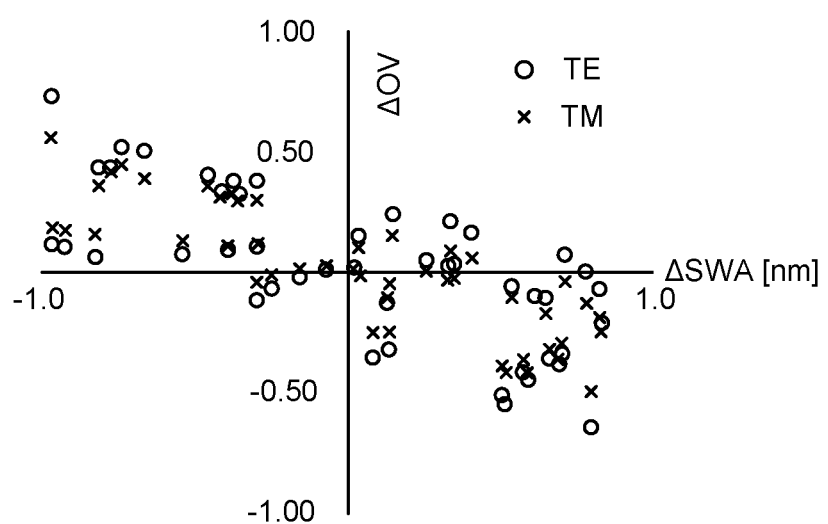

FIGS. 10-12 depict example plots of data derived from simulations such as those described above. FIG. 10 is a plot of values of an asymmetry indicator (in this case DTO) against ΔCD for two different polarizations (TE and TM). FIG. 11 is a plot of values of the asymmetry indicator (DTO) against ΔSWA for two different polarizations (TE and TM). FIG. 12 is a plot of overlay measurement error ΔOV against ΔCD for two different polarizations (TE and TM). FIG. 13 is a plot of overlay measurement error ΔOV against ΔSWA for two different polarizations (TE and TM). By fitting a straight line to each of the two sets of data points in each of the four plots of FIGS. 10-12 it is possible to obtain mean sensitivities of the form $S_{P,b}^{a}$ equal to the gradient of each line, where a denotes the asymmetry mode (e.g. ΔSWA or ΔCD), b denotes either the value of the asymmetry indicator (e.g. DTO) or the overlay measurement error ΔOV, and P denotes polarization.

The sensitivities derived from FIGS. 10 and 11 may be presented as the following sensitivity matrix to define an expected relationship between ΔCD/ΔSWA and DTO ($DTO_{TE}$ and $DTO_{TM}$) as follows:

$$\begin{pmatrix} DTO_{TE} \\ DTO_{TM} \end{pmatrix} = \begin{pmatrix} S_{TE,DTO}^{\Delta CD} & S_{TE,DTO}^{\Delta SWA} \\ S_{TM,DTO}^{\Delta CD} & S_{TM,DTO}^{\Delta SWA} \end{pmatrix} \begin{pmatrix} \Delta CD \\ \Delta SWA \end{pmatrix}$$

The sensitivities derived from FIGS. 12 and 13 may be presented as the following sensitivity matrix to define an expected relationship between ΔCD/ΔSWA and ΔOV ($\Delta OV_{TE}$ and $\Delta OV_{TM}$) as follows:

$$\begin{pmatrix} \Delta OV_{TE} \\ \Delta OV_{TM} \end{pmatrix} = \begin{pmatrix} S_{TE,\Delta OV}^{\Delta CD} & S_{TE,\Delta OV}^{\Delta SWA} \\ S_{TM,\Delta OV}^{\Delta CD} & S_{TM,\Delta OV}^{\Delta SWA} \end{pmatrix} \begin{pmatrix} \Delta CD \\ \Delta SWA \end{pmatrix}$$

In an embodiment, a verification procedure is performed to check that the sensitivity matrices are accurate. In an embodiment, the verification procedure comprises applying large random variations to the model of the calibration target and checking whether the resulting sensitivities remain sufficiently constant. In an alternative embodiment, the verification procedure comprises measuring values of the asymmetry indicator of multiple physical calibration targets on one or more substrates and using the sensitivities obtained as described above with reference to FIGS. 10 and 11 to obtain an estimate for the two asymmetry modes ΔCD and ΔSWA. This may be achieved for example via the following equation:

$$\begin{pmatrix} \Delta CD \\ \Delta SWA \end{pmatrix} = \begin{pmatrix} S_{TE,DTO}^{\Delta CD} & S_{TE,DTO}^{\Delta SWA} \\ S_{TM,DTO}^{\Delta CD} & S_{TM,DTO}^{\Delta SWA} \end{pmatrix}^{-1} \begin{pmatrix} DTO_{TE} \\ DTO_{TM} \end{pmatrix}$$

In an embodiment, the procedure further comprises using the obtained estimates of the two asymmetry modes ΔCD and ΔSWA to calculate the overlay measurement errors for the two polarizations, $\Delta OV_{TE}$ and $\Delta OV_{TM}$, using the sensitivities obtained as described above with reference to FIGS. 12 and 13. This may be achieved for example using the following equation:

$$\begin{pmatrix} \Delta OV_{TE} \\ \Delta OV_{TM} \end{pmatrix} = \begin{pmatrix} S_{TE,\Delta OV}^{\Delta CD} & S_{TE,\Delta OV}^{\Delta SWA} \\ S_{TM,\Delta OV}^{\Delta CD} & S_{TM,\Delta OV}^{\Delta SWA} \end{pmatrix} \begin{pmatrix} \Delta CD \\ \Delta SWA \end{pmatrix}$$

In an embodiment, the verification procedure comprises performing a comparison for each calibration target between the overlay measurement errors $\Delta OV_{TE}$ and $\Delta OV_{TM}$ calculated using the sensitivity matrices as described above and overlay measurement errors determined by a reference tool such as an e-beam device as described above (e.g. by determining for each polarization: $\Delta OV = OV_{ref} - OV_{A^+A^-}$, where $OV_{ref}$ is determined by the reference tool and $OV_{A^+A^-}$ is determined from a plot of $A^+$ against $A^-$). If the correlation between the overlay measurement errors determined from the sensitivity matrices and the overlay measurement errors determined using the reference tool is sufficiently high (e.g. such that a correlation parameter such as $R^2$ is higher than a predetermined threshold value), it can be concluded that the sensitivity matrices can be used to determine overlay in a target structure. If the correlation is too low (e.g. such that the correlation parameter is lower than the predetermined threshold value), the sensitivity matrices may be adjusted and the verification procedure repeated in an iterative process until sensitivity matrices are obtained for which the correlation parameter is above the predetermined threshold value. The adjustment of the sensitivity matrices may be achieved by adjusting one or more parameters of the simulation used to obtain the sensitivity matrices, such as one or more parameters of the model representing the calibration structure. Alternatively or additionally, the wavelengths and/or polarizations used in the simulation may be adjusted. Adjusting the wavelengths and/or polarizations may provide information about an optimal set of wavelengths and/or polarizations to use when measuring a target structure.

When sensitivity matrices have been obtained that achieve a satisfactorily high correlation between the overlay measurement errors calculated based on the sensitivity matrices and the overlay measurement errors determined by the reference tool, the sensitivity matrices provide a mathematical mapping between the values of the asymmetry indicator (e.g. $DTO_{TE}$ and $DTO_{TM}$) and overlay measurement errors (e.g. $\Delta OV_{TE}$ and $\Delta OV_{TM}$). The sensitivity matrices are thus an example representation of the relationship between values of the asymmetry indicator and overlay measurement errors for a model-based approach.

Figure 14:
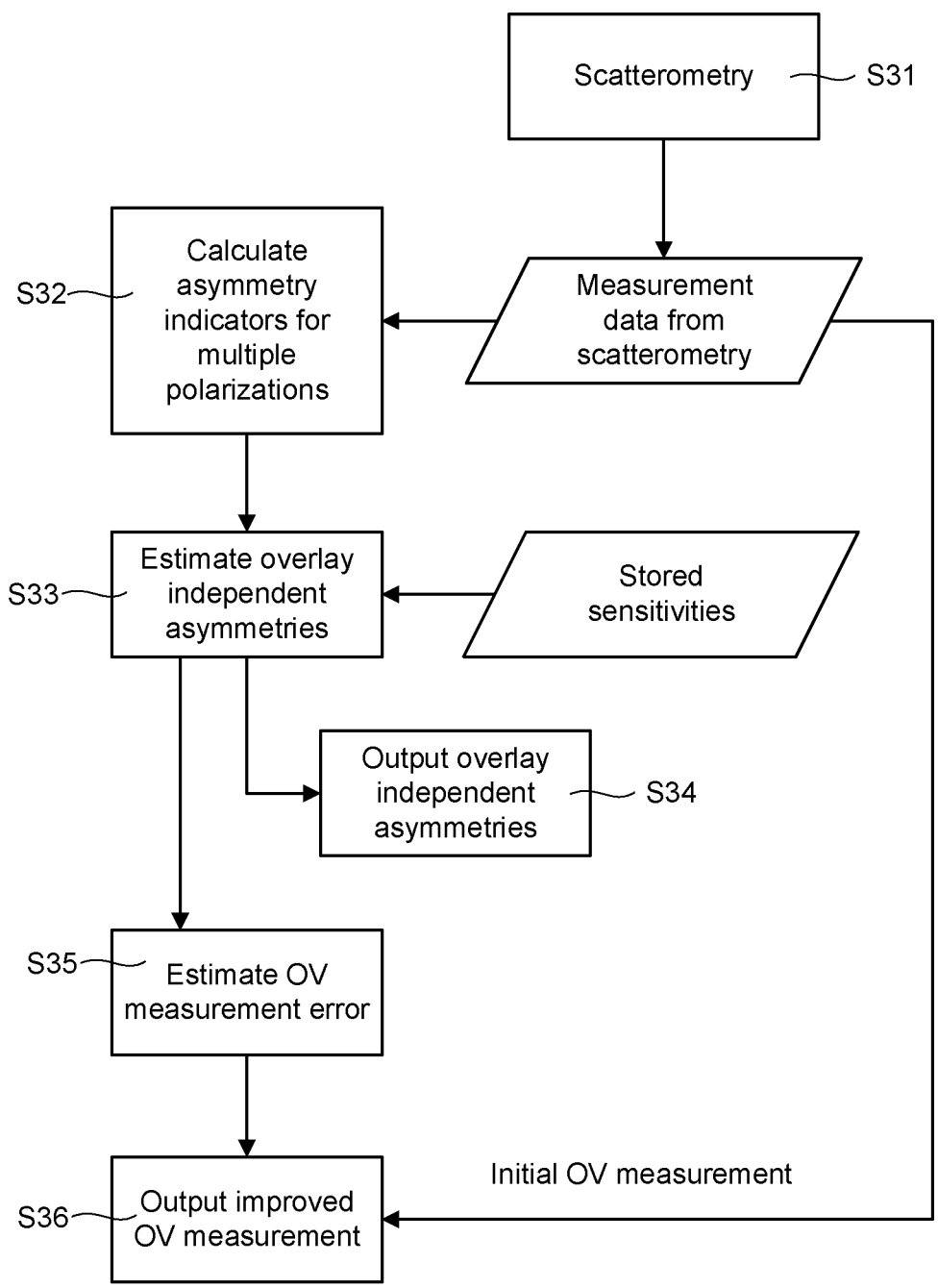
FIG. 14 is a flow chart depicting a method of determining information about a target structure using sensitivities determined according to the approach described with reference to FIGS. 9-13.

FIG. 14 depicts a method of determining information about a target structure using a relationship between values of an asymmetry indicator and overlay measurement errors determined via a model-based approach such as discussed above with reference to FIGS. 9-13.

In step S31, the target structure is measured using scatterometry. The measurement may be performed in any of the ways discussed above with reference to step S1 of FIG. 7.

In step S32, measurement data from the scatterometry is used to obtain a value of each of one or more asymmetry indicators for the target structure. Each asymmetry indicator may take any of the forms described above. In an embodiment, the scatterometry is performed for each of plural different polarizations and the value of the asymmetry indicator comprises a DTO. In a case where the polarizations comprise a TE polarization and a TM polarization, the obtained values of the asymmetry indicator may be referred to as $DTO_{TE}$ and $DTO_{TM}$.

In step S33, each of one or more overlay independent asymmetries is estimated using the corresponding value of an asymmetry indicator obtained in step S32 and stored sensitivities. The stored sensitivities may be obtained from simulation as described above with reference to FIGS. 9-13. In an embodiment, each of one or more overlay independent asymmetries in the target structure is calculated using the sensitivities of the asymmetry indicator to each of multiple asymmetry modes (e.g. $\Delta CD$ and $\Delta SWA$) and the obtained asymmetry indicator for the target structure. In this example, step S33 may use the following equation to estimate overlay independent asymmetries $\Delta CD$ and $\Delta SWA$:

$$\begin{pmatrix} \Delta CD \\ \Delta SWA \end{pmatrix} = \begin{pmatrix} S^{\Delta CD}_{TE,DTO} & S^{\Delta SWA}_{TE,DTO} \\ S^{\Delta CD}_{TM,DTO} & S^{\Delta SWA}_{TM,DTO} \end{pmatrix}^{-1} \begin{pmatrix} DTO_{TE} \\ DTO_{TM} \end{pmatrix}$$

The estimated overlay independent asymmetries may be used to obtain an improved measure of overlay, as described below. The estimated overlay asymmetries may also be of interest in themselves and therefore be output independently (in step S34). In an embodiment, the estimated overlay independent asymmetries are output for a plurality of target structures at different positions on a substrate W and thereby provide a map of overlay independent asymmetries across the substrate. This information may be used to adapt lithographic processes to improve formation of subsequent target structures (e.g. to reduce the overlay independent asymmetries).

In step S35, estimated overlay independent asymmetries obtained in step S33 are used to estimate an error in each of one or more initial overlay measurements performed on the target structure at a previous time. In an embodiment, the estimation of the error in the initial measurement of overlay is calculated using the sensitivities of the overlay measurement error to each of multiple asymmetry modes (e.g. via a sensitivity matrix) and each of one or more calculated overlay independent asymmetries. In an embodiment, the initial overlay measurement is obtained from the gradient s of a best fit line in a plot of $A^+$ against $A^-$ as described above. In the present example where the scatterometry in step S31 was performed using TE and TM polarizations, the initial overlay measurement may be obtained independently for each of the two polarizations. Step S35 may thus estimate the error in the initial overlay measurement for each of the two polarizations, $\Delta OV_{TE}$ and $\Delta OV_{TM}$. In the present example this can be achieved using the following equation:

$$\begin{pmatrix} \Delta OV_{TE} \\ \Delta OV_{TM} \end{pmatrix} = \begin{pmatrix} S^{\Delta CD}_{TE,\Delta OV} & S^{\Delta SWA}_{TE,\Delta OV} \\ S^{\Delta CD}_{TM,\Delta OV} & S^{\Delta SWA}_{TM,\Delta OV} \end{pmatrix} \begin{pmatrix} \Delta CD \\ \Delta SWA \end{pmatrix}$$

In step S36, the estimated errors in the initial overlay measurements, $\Delta OV_{TE}$ and $\Delta OV_{TM}$, are used to correct the initial overlay measurements (derived from the measurement from the scatterometry in step S31) and thereby derive an improved overlay measurement for output.

Thus, the model-based approach makes it possible to estimate an overlay independent asymmetry in a target structure using a component of a relationship between values of the asymmetry indicator and overlay measurement errors (e.g. the appropriate one of the two sensitivity matrices mentioned above) derived from simulations of scattering (e.g. as in step S33 discussed above). The estimated overlay independent asymmetry can then be used to perform the estimation of the error in the initial overlay measurement (e.g. as in step S35 discussed above).

As discussed above, there is a correlation between the overlay independent asymmetry and the overlay measurement error. The inventors have recognized that the overlay independent asymmetry will normally have a first component that contributes to overlay measurement error and a second component that does not contribute to overlay measurement error. The inventors have further recognized that the second component varies between different polarizations in the scatterometry less than the first component. Thus, by combining measurement data from scatterometry performed with different polarizations it is possible to increase the sensitivity with which the overlay measurement error can be determined.

In an embodiment, based on this insight, the method of FIG. 7 may be adapted so that the value of the asymmetry indicator is obtained by combining a first asymmetry value and a second asymmetry value. The first asymmetry value is obtained using information about asymmetry in first scattered radiation from the target structure at each of plural different wavelengths of the radiation. The second asymmetry value is obtained using information about asymmetry in second scattered radiation from the target structure at each of plural different wavelengths of the radiation. The first scattered radiation originates from incident radiation having a first polarization. The second scattered radiation originates from incident radiation having a second polarization, different from the first polarization. In an embodiment, the first polarization is orthogonal to the second polarization. In one class of embodiment, the first asymmetry value comprises the DTO obtained using TE polarized radiation (as an example of the first polarization) and the second asymmetry value comprises the DTO obtained using TM polarized radiation (as an example of the second polarization).

In an embodiment, the combination of the first asymmetry value and the second asymmetry value comprises a weighted sum. The weightings of the first asymmetry value and the second asymmetry value may be adjusted to achieve a good matching between the estimated overlay measurement error and a real overlay measurement error. In an embodiment, a weighting of the first asymmetry value in the weighted sum is opposite in sign to a weighting of the second asymmetry value in the weighted sum. In this way, the contribution from the first asymmetry value at least partially cancels the contribution from the second asymmetry value. In an embodiment, the cancelling is such that the second component of the overlay independent asymmetry (the component that does not contribute to overlay measurement error) cancels out to a greater extent than the first component of the overlay independent asymmetry (the component that does contribute to overlay measurement error). Arranging for the weightings of the first and second asymmetry values to have opposite sign thus decreases the strength of the second component of the overlay independent asymmetry relative to the first component of the overlay independent asymmetry in the signal and thereby improves sensitivity to the first component. In an embodiment, the weighting of the first asymmetry value is equal to and opposite in sign to the weighting of the second asymmetry value, such that a difference is effectively obtained between the first asymmetry value and the second asymmetry value.

Figure 15:
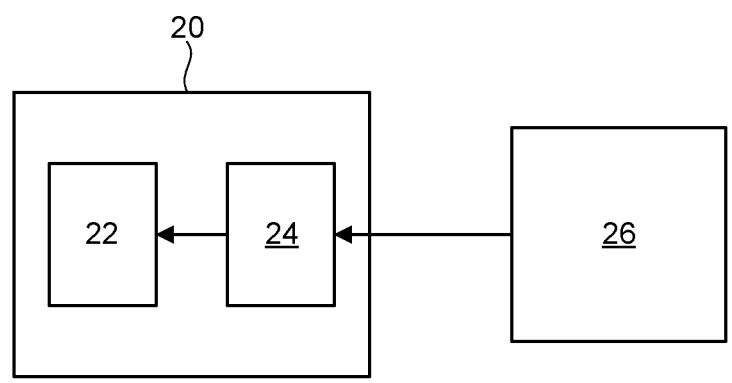
FIG. 15 depicts a system for determining information about a target structure.

FIG. 15 depicts as system 20 for determining information about a target structure on a substrate W. The system 20 comprises a processor 22. The processor 22 may comprise any of the known hardware, firmware or software elements (e.g. CPUs, memory, storage devices, communication buses, etc.) necessary to allow the required data processing operations to be performed. The system 20 further comprises a data communications interface 24 to allow input and output of data from the system 20. The system 20 is configured so that the processor 22 performs any one or more of the methods for determining information about a target structure on a substrate W described above with reference to FIGS. 1-14. In an embodiment, a scatterometry system 26 is provided for performing scatterometry on the target structure and/or calibration structures. The scatterometry system may be configured to irradiate a target and detect different diffraction orders as described in U.S. Pat. No. 8,339,595B2 and/or WO 2015018625 mentioned above, for example. Measurement data from the scatterometry is provided to the processor 22 via the data communications interface 24. In an embodiment, a computer program may be provided which, when the program is executed by the processor 22, causes the processor 22 to carry out any one or more of the methods for determining information about the target structure on a substrate W described above with reference to FIGS. 1-14.

Any of the above methods, systems or programs may be used as at least part of a method of manufacturing devices using lithographic techniques Furthermore, the techniques disclosed herein can be applied to large scatterometer targets, also referred to as standard targets, the overlay in these larger targets can be measured by angle-resolved scatterometry using a pupil image sensor instead of or in addition to measurements made by a dark-field imaging branch and sensor.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within the control unit LACU of FIG. 2. There may also be provided a data storage medium (e.g., semiconductor memory, magnetic or optical disk) having such a computer program stored therein. Where an existing metrology apparatus is already in production and/or in use, the invention can be implemented by the provision of updated computer program products for causing a processor to perform the steps described above and so calculate overlay error with reduced sensitivity to feature asymmetry. The program may optionally be arranged to control an optical system, substrate support and the like to perform the steps for measurement of intensity asymmetry on a suitable plurality of target structures.

Further embodiments of the current are described in below numbered clauses:

1. A method of determining information about a target structure on a substrate, comprising:
   obtaining a value of an asymmetry indicator for the target structure, the value of the asymmetry indicator representing an amount of an overlay independent asymmetry in the target structure, the overlay independent asymmetry being an asymmetry that is not caused by overlay;
   estimating an error in an initial overlay measurement performed on the target structure at a previous time, the estimation being performed using the obtained value of the asymmetry indicator and a relationship between values of the asymmetry indicator and overlay measurement errors caused at least partially by overlay independent asymmetries; and
   determining overlay in the target structure using the initial overlay measurement and the estimated error.

2. The method of clause 1, wherein the value of the asymmetry indicator is obtained for the target structure using information about asymmetry in radiation scattered from the target structure at each of a set of wavelengths.

3. The method of clause 2, wherein the set of wavelengths is preselected by obtaining the relationship between values of the asymmetry indicator and overlay measurement errors for a plurality of candidate sets of wavelengths and selecting one of the candidate sets of wavelengths based on a quality of correlation between the values of the asymmetry indicator and the overlay measurement errors for that candidate set of wavelengths.

4. The method of any preceding clause, wherein:
   the value of the asymmetry indicator is obtained by combining a first asymmetry value and a second asymmetry value;

the first asymmetry value is obtained using information about asymmetry in first scattered radiation from the target structure at each of plural different wavelengths of the radiation;

the second asymmetry value is obtained using information about asymmetry in second scattered radiation from the target structure at each of plural different wavelengths of the radiation;

the first scattered radiation originates from incident radiation having a first polarization; and the second scattered radiation originates from incident radiation having a second polarization, different from the first polarization.

5. The method of clause 4, wherein the first polarization is orthogonal to the second polarization.

6. The method of clause 4 or 5, wherein the combination of the first asymmetry value and the second asymmetry value comprises a weighted sum.

7. The method of clause 6, wherein a weighting of the first asymmetry value in the weighted sum is opposite in sign to a weighting of the second asymmetry value in the weighted sum.

8. The method of any preceding clause, further comprising deriving the relationship between values of the asymmetry indicator and overlay measurement errors.

9. The method of clause 8, wherein the derivation of the relationship comprises measuring a value of the asymmetry indicator and an overlay measurement error in each of a plurality of calibration structures having different overlay independent asymmetries.

10. The method of clause 8 or 9, wherein the derivation of the relationship comprises simulating scattering of radiation from a calibration structure for a plurality of simulated overlay independent asymmetries in the calibration structure.

11. The method of clause 10, further comprising estimating the overlay independent asymmetry in the target structure using the relationship derived by the simulations.

12. The method of clause 11, wherein the estimated overlay independent asymmetry is used to perform the estimation of the error in the initial overlay measurement.

13. The method of any of clauses 10-12, wherein the simulated overlay independent asymmetries comprise plural magnitudes of asymmetry in each of plural asymmetry modes.

14. The method of clause 13, wherein the plural asymmetry modes comprise:
a first asymmetry mode representing side wall angle asymmetry; and
a second asymmetry mode representing asymmetry in a critical dimension.

15. The method of clause 13 or 14, wherein the derived relationship is represented by calculated sensitivities of:
the asymmetry indicator to each of the asymmetry modes; and
the overlay measurement error to each of the asymmetry modes.

16. The method of clause 15, wherein the derived relationship is represented by calculated sensitivities of:
the asymmetry indicator to each of the asymmetry modes for each of multiple incident polarizations; and
the overlay measurement error to each of the asymmetry modes for each of multiple incident polarizations.

17. The method of clause 15 or 16, wherein the overlay independent asymmetry in the target structure is calculated using the sensitivities of the asymmetry indicator to each of the asymmetry modes and the obtained asymmetry indicator for the target structure.

18. The method of clause 17, wherein the estimation of the error in the initial measurement of overlay is calculated using the sensitivities of the overlay measurement error to each of the asymmetry modes and the calculated overlay independent asymmetry.

19. A system for determining information about a target structure on a substrate, the system comprising a processor configured to:
obtain a value of an asymmetry indicator for the target structure, the value of the asymmetry indicator representing an amount of an overlay independent asymmetry in the target structure, the overlay independent asymmetry being an asymmetry that is not caused by overlay;
estimate an error in an initial overlay measurement performed on the target structure at a previous time, the estimation being performed using the obtained value of the asymmetry indicator and a relationship between values of the asymmetry indicator and overlay measurement errors caused at least partially by overlay independent asymmetries; and
determine overlay in the target structure using the initial overlay measurement and the estimated error.

20. A computer program comprising instructions which, when the program is executed by a processor, cause the processor to carry out the method of any of clauses 1-18.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of determining information about a target structure on a substrate, comprising:

obtaining a value of an asymmetry indicator for the target structure, the value of the asymmetry indicator representing an amount of an overlay independent asymmetry in the target structure, the overlay independent asymmetry being an asymmetry that is not caused by overlay;

estimating an error in an initial overlay measurement performed on the target structure at a previous time, the estimation being performed using the obtained value of the asymmetry indicator and a relationship between values of the asymmetry indicator and overlay measurement errors caused at least partially by overlay independent asymmetries; and determining overlay in the target structure using the initial overlay measurement and the estimated error.

2. The method of claim 1, wherein the value of the asymmetry indicator is obtained for the target structure using information about asymmetry in radiation scattered from the target structure at each of a set of wavelengths.

3. The method of claim 2, wherein the set of wavelengths is preselected by obtaining the relationship between the values of the asymmetry indicator and the overlay measurement errors for a plurality of candidate sets of wavelengths and selecting one of the candidate sets of wavelengths based on a quality of correlation between the values of the asymmetry indicator and the overlay measurement errors for that candidate set of wavelengths.

4. The method of claim 1, wherein:

the value of the asymmetry indicator is obtained by combining a first asymmetry value and a second asymmetry value;

the first asymmetry value is obtained using information about asymmetry in first scattered radiation from the target structure at each of a plurality of different wavelengths of the radiation;

the second asymmetry value is obtained using information about asymmetry in second scattered radiation from the target structure at each of the plurality of different wavelengths of the radiation;

the first scattered radiation originates from incident radiation having a first polarization; and the second scattered radiation originates from incident radiation having a second polarization, different from the first polarization.

5. The method of claim 4, wherein the first polarization is orthogonal to the second polarization.

6. The method of claim 4, wherein the combination of the first asymmetry value and the second asymmetry value comprises a weighted sum.

7. The method of claim 6, wherein a weighting of the first asymmetry value in the weighted sum is opposite in sign to a weighting of the second asymmetry value in the weighted sum.

8. The method of claim 1, further comprising deriving a relationship between values of the asymmetry indicator and overlay measurement errors.

9. The method of claim 8, wherein the derivation of the relationship comprises measuring a value of the asymmetry indicator and an overlay measurement error in each of a plurality of calibration structures having different overlay independent asymmetries.

10. The method of claim 8, wherein the derivation of the relationship comprises simulating scattering of radiation from a calibration structure for a plurality of simulated overlay independent asymmetries in the calibration structure.

11. The method of claim 10, further comprising estimating the overlay independent asymmetry in the target structure using the relationship derived by the simulations.

12. The method of claim 11, wherein the estimated overlay independent asymmetry is used to perform the estimation of the error in the initial overlay measurement.

13. The method of claim 1, wherein the simulated overlay independent asymmetries comprise a plurality of magnitudes of asymmetry in each of a plurality of asymmetry modes.

14. A computer program comprising instructions that, when the program is executed by a processor, cause the processor to carry out the method of claim 1.

15. A system for determining information about a target structure on a substrate, the system comprising a processor configured to:

obtain a value of an asymmetry indicator for the target structure, the value of the asymmetry indicator representing an amount of an overlay independent asymmetry in the target structure, the overlay independent asymmetry being an asymmetry that is not caused by overlay;

estimate an error in an initial overlay measurement performed on the target structure at a previous time, the estimation being performed using the obtained value of the asymmetry indicator and a relationship between values of the asymmetry indicator and overlay measurement errors caused at least partially by overlay independent asymmetries; and determine overlay in the target structure using the initial overlay measurement and the estimated error.

* * * * *